United States Patent [19]

Pizzeck

[11] 3,964,813

[45] June 22, 1976

[54] CONNECTOR

[75] Inventor: Donald E. Pizzeck, Hampton, Va.

[73] Assignee: The United States of America as represented by the United States National Aeronautics and Space Administration, Washington, D.C.

[22] Filed: Feb. 10, 1975

[21] Appl. No.: 548,468

[52] U.S. Cl. ............................ 339/17 M; 339/18 C
[51] Int. Cl.² ..................... H05K 1/10; H01R 25/00
[58] Field of Search ............ 339/17 R, 17 C, 17 M, 339/17 E, 18, 95 R, 112 R, 220, 221; 179/16 HS

[56] References Cited
UNITED STATES PATENTS

| | | | |
|---|---|---|---|
| 2,931,003 | 3/1960 | Huetten et al. | 339/17 LM |
| 3,093,887 | 6/1963 | Prestige et al. | 339/95 R X |
| 3,258,730 | 6/1966 | Husband et al. | 339/18 C |
| 3,774,142 | 11/1973 | Siegler | 339/95 R |
| 3,866,998 | 2/1975 | Iantorno | 339/220 R |

FOREIGN PATENTS OR APPLICATIONS

| | | | |
|---|---|---|---|
| 1,125,123 | 10/1956 | France | 339/17 E |
| 1,150,441 | 2/1959 | France | 339/17 M |

OTHER PUBLICATIONS

Aham; "Low Power Heat Sinks," Literature Rec'd on 11/1/74 for Aham 200 Series Coolers.

Primary Examiner—Joseph H. McGlynn
Assistant Examiner—Craig R. Feinberg
Attorney, Agent, or Firm—Howard J. Osborn; William H. King; John R. Manning

[57] ABSTRACT

A connector for connecting circuits located on different layers of a multilayer printed circuit board through a hole in the board. The connector is a hollow cylindrical conductor made from a conductive, metallic, springy material. A slit in the conductor and a plurality of sharp teeth located on the outside of the conductor extend the full length of the conductor. The conductor has a slightly larger outside diameter than the diameter of the hole. Consequently, when the connector is forced into the hole the springback (resiliency) of the connector forces the teeth against the circuits on the printed circuit board thereby providing a positive connection between the circuits.

3 Claims, 4 Drawing Figures

CONNECTOR

ORIGIN OF THE INVENTION

The invention described herein was made by an employee of the United States Government and may be manufactured and used by or for the Government for Governmental purposes without the payment of any royalties thereon or therefor.

BACKGROUND OF THE INVENTION

The invention relates generally to electrical connectors and more specifically concerns a connector for making connections between circuits located on different layers of a multilayer printed circuit board.

In the past, copper plating has usually been used to connect through a hole the circuits located on different layers of multilayer printed circuit boards. The copper plating method of connecting the circuits, in addition to being costly and time consuming, has the disadvantage of possible cracking of the plating in the hole due to the differential of thermal expansion of the copper and the laminate. Many times when this happens the board has to be discarded because it is not repairable. Even when a board is repairable it is time consuming and costly. It is therefore the primary purpose of this invention to provide a connector for connecting the circuits on different layers of a multilayer printed circuit board.

SUMMARY OF THE INVENTION

The connector that constitutes this invention is a hollow cylindrical conductor made from a conductive, metallic, resilient material. A plurality of sharp teeth located on the outside of the conductor and a slit in the conductor extend the full length of the conductor. The conductor is made to have a slightly larger outside diameter than the diameter of the hole in a multilayer printed circuit board that it is to fit into. Consequently, when the connector is forced into the hole the spring-back of the conductor forces the teeth against the circuits on the printed circuit board thereby providing a positive connection between the circuits.

DETAILED DESCRIPTION OF THE INVENTION

Figure 1:
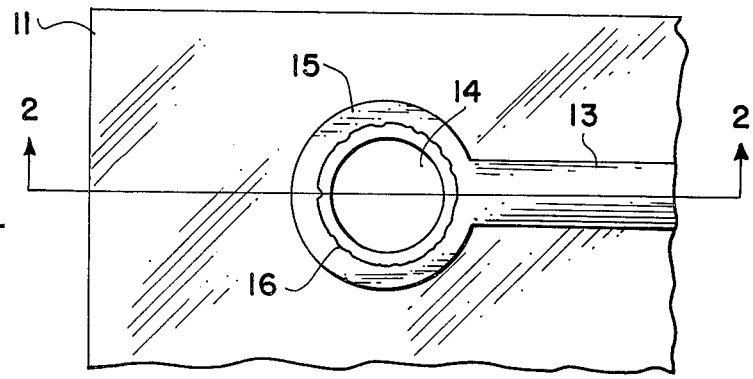
FIG. 1 is a plan view of a portion of a prior art multilayer printed circuit board.
Figure 2:
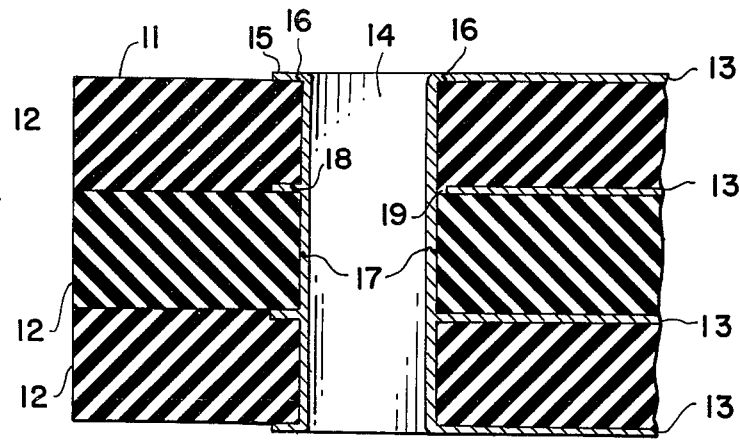
FIG. 2 is the Section 2—2 view of FIG. 1.

A portion of a prior art multilayer printed circuit board 11 is shown in FIGS. 1 and 2 for the purpose of describing the problem solved by the present invention. FIG. 2 is the cross-section view 2—2 of FIG. 1. The board 11 includes several layers 12 with a printed circuit 13 located on each layer of the board 11. Ordinarily the circuits 13 are connected together through a hole 14 in the board by means of copper plating 15. In addition to the copper plating of the hole being costly and time consuming it sometimes cracks as indicated by lines 16, 17, and 18. The cracks are usually the result of thermal stresses which cause expansion and contraction of the board. Many times these cracks can be repaired; however, if they occur on one of the concealed circuits and a gap 19 is formed the board usually has to be discarded.

Figure 3:
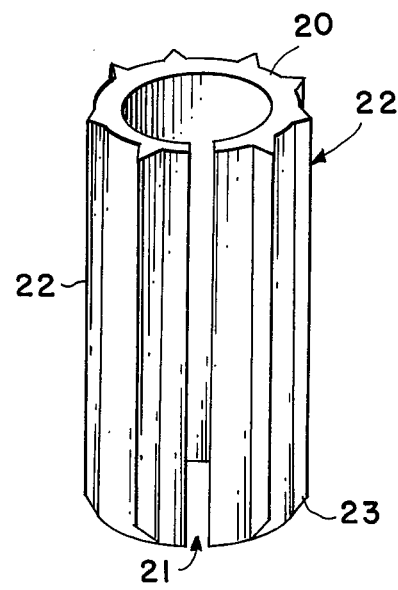
FIG. 3 is a schematic drawing of a preferred embodiment of the invention.

The connector in FIG. 3 can be used instead of the copper plating. It consists of a hollow cylindrical conductor 20 made from a resilient material such as, for example, beryllium copper or spring steel. A slit 21 extends the full length of the conductor 20. A plurality of sharp teeth 22 (preferably eight or more) are located on the outside surface of the conductor and extend the full length of the conductor. One end of each of the teeth 22 is beveled 23 to provide guidance into a printed circuit board hole.

To use the connector in FIG. 3 on a newly constructed board, instead of copper plating, the circuits 13 are brought out to the periphery of the hole and a connector with a slightly larger outside diameter than the diameter of the hole is forced into the hole. The connector can be forced into the hole because of slit 21. Once the connector is forced into the hole, the resiliency of the connector forces the teeth into circuits 13 thereby providing a positive connection between the different circuits. Any time the board expands or contracts in a direction perpendicular to the longitudinal direction of the connector the slit and the resiliency of the connector will cause the teeth of the connector to maintain contact with the circuits on the different layers of the board. Any time the board expands or contracts in a direction parallel to the longitudinal direction of the connector, the circuits will slide along the teeth of the connector thereby maintaining contact with the connector without putting a strain on the circuits.

Figure 4:
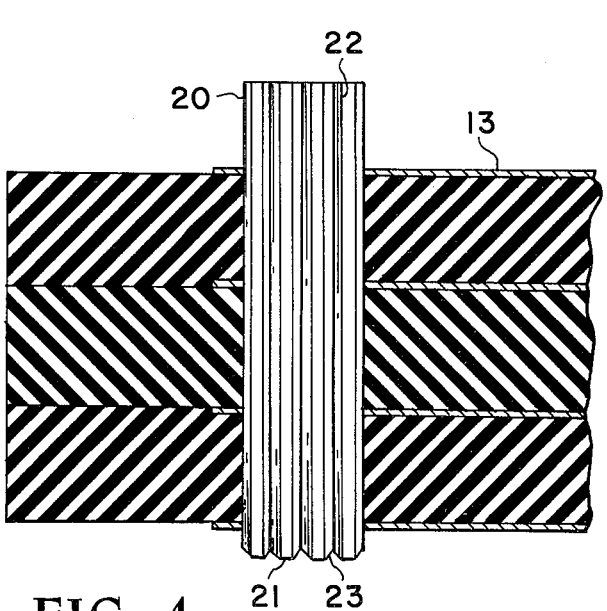
FIG. 4 demonstrates how the connector in FIG. 3 is fitted into the multilayer printed circuit board in FIG. 2.

FIG. 4 demonstrates how the connector can be used to save a damaged copper plated board such as shown in FIGS. 1 and 2. First, the hole 14 is redrilled to take out all of the copper plating 15 and such that the circuits 13 all extend to the periphery of the hole. Consequently, the crack 16, 17 and 18, and the gap 19 are eliminated. Then a connector with a slightly larger diameter than the diameter of the hole is forced into the hole. The length of the connector can be made somewhat longer than the thickness of the board to provide a convenient point to make measurements or connections to the circuit.

The dimensions of the connector depend on the size of the hole and the thickness of the board. However, normal dimensions would be about 0.035 inch outside diameter, 0.020 inch inside diameter, 0.125 inch length (for 0.061 inch board), 0.003 inch tooth depth and 0.005 inch slit.

The advantages of the invention are that it is inexpensive, it is easy to use, it is easy to replace and it is not subject to the strains that copper plating is subject to during thermal expansion and contraction of the board.

What is claimed is:

1. A multi-layer printed circuit board having a hole through it with circuits on different layers of the board extending to the periphery of the hole;
   a connector in said hole for connecting said circuits on different layers of said board comprising:
   a cylindrical conductor hollow throughout its entire length having an outside diameter slightly larger than the diameter of said hole and made from a conductive, springy material;
   several teeth on the outside surface of said conductor with each tooth extending the full length of said conductor; and a single slit in said conductor extending the full length of the conductor whereby the springback of said conductor forces said teeth into contact with all of said circuits extending to the periphery of said hole.

2. A connector according to claim 1 wherein said plurality of teeth are beveled at one end to provide guidance into said hole.

3. A connector according to claim 1 wherein a cross-section of said teeth is an isosceles triangle.

* * * * *